US 9,704,637 B2

(12) United States Patent
van Vroonhoven et al.

(10) Patent No.: US 9,704,637 B2
(45) Date of Patent: Jul. 11, 2017

(54) METHOD AND APPARATUS FOR DEMAGNETIZING TRANSFORMER CORES IN CLOSED LOOP MAGNETIC CURRENT SENSORS

(71) Applicant: TEXAS INSTRUMENTS DEUTSCHLAND GMBH, Freising (DE)

(72) Inventors: Caspar Petrus Laurentius van Vroonhoven, Muchich (DE); Sudarshan Udayashankar, Freising (DE); Gebhard Haug, Mossingen (DE); Mikhail Valeryevich Ivanov, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 306 days.

(21) Appl. No.: 14/176,171

(22) Filed: Feb. 10, 2014

(65) Prior Publication Data
US 2015/0016006 A1    Jan. 15, 2015

Related U.S. Application Data

(60) Provisional application No. 61/846,408, filed on Jul. 15, 2013.

(51) Int. Cl.
| H01F 13/00 | (2006.01) |
| H01F 27/42 | (2006.01) |
| G01R 15/18 | (2006.01) |

(52) U.S. Cl.
CPC ......... *H01F 13/006* (2013.01); *H01F 27/427* (2013.01); *G01R 15/185* (2013.01)

(58) Field of Classification Search
CPC ..................................................... H01F 13/006
See application file for complete search history.

(56) References Cited

U.S. PATENT DOCUMENTS

| 3,571,700 A | 3/1971 | Paine et al. |
| 4,462,059 A | 7/1984 | Yamagami et al. |
| (Continued) | | |

FOREIGN PATENT DOCUMENTS

| CN | 101702361 A | 5/2010 |
| DE | 10204424 C1 | 9/2003 |
| (Continued) | | |

OTHER PUBLICATIONS

Bazzocchi, et al. "Interference rejection algorithm for current measurement using magnetic sensor arrays", Sensors and Actuators 85 (2000), pp. 38-41.

(Continued)

*Primary Examiner* — Thienvu Tran
*Assistant Examiner* — Tien Mai
(74) *Attorney, Agent, or Firm* — Gregory J. Albin; Charles A. Brill; Frank D. Cimino

(57) ABSTRACT

Automated degaussing methods and apparatus are presented for degaussing a magnetic core in close loop fashion, in which a plurality of pulses are applied to a compensation coil magnetically coupled with the core with duration or energy being decreased in succeeding pulse cycles according to a discrete feedback algorithm, and with individual pulse polarities being set according to core magnetization polarity measured subsequent to an immediately preceding pulse.

20 Claims, 10 Drawing Sheets

(56) References Cited

U.S. PATENT DOCUMENTS

| | | | |
|---|---|---|---|
| 6,160,697 A | 12/2000 | Edel | |
| 6,278,272 B1 | 8/2001 | Scarzello et al. | |
| 6,984,979 B1 * | 1/2006 | Edel | 324/253 |
| 7,298,141 B2 | 11/2007 | Bartington | |
| 7,391,210 B2 | 6/2008 | Zhang et al. | |
| 7,391,211 B2 | 6/2008 | Cripe | |
| 8,339,133 B2 | 12/2012 | Teppan | |
| 2007/0115603 A1 | 5/2007 | Maurer | |

FOREIGN PATENT DOCUMENTS

| | | |
|---|---|---|
| JP | S 56128468 | 10/1981 |
| JP | S 63268209 | 11/1988 |
| JP | H 02214393 | 8/1990 |

OTHER PUBLICATIONS

Dezuari, et al. "Printed circuit board integrated fluxgate sensor", Sensors and Actuators 81 (2000), pp. 200-203.

Tang, et al. "Excitation circuit for fluxgate sensor using saturable inductor", Sensors and Actuators A 113 (2004), pp. 156-165.

"Sensor Signal Conditioning IC for Closed-Loop Magnetic Current Sensor", Texas Intruments, DRV401, SBVS070B—Jun. 2006, Revised May 2009.

"Sensor Signal Conditioning IC for Closed-Loop Magnetic Current Sensors", Texas Instruments, DRV411, SBOS693B, Aug. 2013, Revised Dec. 2013.

First Office Action (English translation), Chinese Patent Application No. 201480040612.1, mailed Feb. 23, 2017, 3 pages.

* cited by examiner

METHOD AND APPARATUS FOR DEMAGNETIZING TRANSFORMER CORES IN CLOSED LOOP MAGNETIC CURRENT SENSORS

This application claims priority to and the benefit of U.S. Provisional Patent Application Ser. No. 61/846,408 that was filed on Jul. 15, 2013 and is entitled METHOD TO DEMAGNETIZE TRANSFORMER CORES IN CLOSED LOOP MAGNETIC CURRENT SENSORS, the entirety of which is incorporated by reference herein.

FIELD OF THE INVENTION

The present disclosure relates to current sensors and more particularly to improved sensor core demagnetizing techniques and apparatus for closed loop magnetic current sensors.

BACKGROUND

Closed loop current sensors interface with a high magnetic permeability core encircling a primary winding or primary conductor, with a secondary winding or compensation coil driven by the sensor until the magnetic flux within the core is zero. The secondary current at this point is measured and is generally proportional to the primary current. Closed loop current sensors provide good accuracy and galvanic isolation and are thus preferred solutions for sensing current flow in many industrial applications. In operation, the core of the closed loop current sensor operates like a transformer core with respect to the primary and secondary currents. However, the core may be magnetized over time, leading to an offset and degradation in the accuracy of the current sensing performance. For example, exposure of the core to strong fields from external magnets or overcurrent conditions in a host system may lead to undesirable magnetization of the transformer core. Furthermore, the core may be magnetized through significant primary current flow while the sensor is unpowered. Magnetization of the transformer core leads to a magnetic domain offset, causing an offset in the feedback current applied to the secondary winding, and thus limits the precision and dynamic range of the magnetic current sensor. Moreover, it is difficult to track or predict the amount of such magnetization for different cores.

Sensor core magnetization has been addressed in part through calibration or offset cancellation techniques in the electrical domain. However, this approach does not reduce the magnetic domain offset. In addition, offset calibration in the electrical domain is expensive and time-consuming, and susceptible to thermal drift.

Open loop degaussing or demagnetizing techniques have been tried, in which an AC signal is applied to the magnetic core that increases in frequency and/or decays in amplitude. These degaussing techniques, however, cannot reliably achieve the accuracy required for many applications, such as differential current sensing in which the (small) difference between two primary currents must be sensed accurately. In particular, timing errors, external magnetization effects during the degaussing operation, and the uncertainty in the end position on the flux density-magnetic field strength (B-H) curve when the demagnetization process completes limit the ability to accurately degauss a sensing core, and these techniques commonly only achieve a final accuracy of ±10% of initial magnetization. Furthermore, it is not possible to record the initial state of magnetization to keep track of systematic magnetization. Another drawback is the length of time required for degaussing, since lack of knowledge regarding the initial magnetization level requires full magnetization of the core in a certain direction, and then a full-length demagnetization sequence in the other direction. Thus, while existing degaussing and offset calibration options provide some improvement over operating with a magnetized transformer core, many applications for close loop magnetic current sensors require accuracies that cannot be achieved using these techniques. A need therefore remains for improved degaussing or demagnetizing methods and apparatus for closed loop magnetic current sensors and other demagnetization applications.

SUMMARY

The present disclosure provides demagnetizing or degaussing techniques and apparatus for full or partial demagnetization of a core in automated closed-loop fashion, by which the above and other shortcomings of conventional approaches can be mitigated or overcome.

Various aspects of the disclosure involve automatic degaussing apparatus, including sensor interface circuitry interfaced with a magnetic sensor and providing an output signal representing the magnetization polarity of the core, as well as a coil interface with outputs coupleable to the ends of a secondary or compensation coil magnetically coupled with the core. The apparatus further includes control circuitry which automatically causes the coil interface to selectively apply pulses to the core via the compensation coil, and to control the pulse polarity and energy based at least partially on the sensor interface output signal to wholly or partially facilitate core degaussing or demagnetization in a closed-loop fashion using a discrete feedback algorithm.

In certain embodiments, the control circuitry generates individual pulse cycles in a first state through connection of a given one of the coil interface outputs to a pulse voltage supply node and connection of the other output to a common node, and connects both the outputs to the common node in a second state. The control circuitry chooses or selects the given output for a succeeding first state according to the sensor interface circuit output signal received from during the immediately preceding second state to provide the next pulse to change magnetization of the core in a direction opposite to the most recently measured magnetization polarity.

In certain embodiments, moreover, the control circuitry controls the duration of the first state in successive poll cycles to be less than that of the immediately preceding pulse cycle, such as greater than half the duration of the immediately preceding pulse cycle in certain implementations.

The control circuitry may control the duration of the second state in certain embodiments to allow current flow in the compensation coil to decrease to substantially zero before selecting the given output for the succeeding first state.

In certain embodiments, moreover, the control circuitry obtains a magnetization polarity measurement prior to application of the first pulse according to the measured polarity. In other embodiments, the control circuitry initiates the first pulse with a preselected or randomly selected polarity prior to measuring the core magnetization.

In certain embodiments, the sensor interface circuitry provides the output signal indicating a magnetization magnitude as well as the magnetization polarity of the core, and the control circuitry controls the duration of the first state in the first pulse at least partially according to the magnetization magnitude indicated by the output signal. In this manner, the time required for the entire degaussing operation may be reduced.

In addition, the control circuitry in certain implementations may discontinue application of pulses when a predetermined termination condition has been met, and may provide a Boolean code representing polarities of the individual pulses applied during the degaussing operation, for example, to allow a host system to assess the magnetization condition of the core before the automatic degaussing operation was started.

In certain embodiments, the control circuitry operates the sensor interface circuit in the coil interface circuit in a first mode to automatically degauss the magnetic core, and in a different second mode to provide closed loop current sensing, thus facilitating provision of a single apparatus for operating in degaussing a core of a closed loop current sensor system. In addition, the sensor interface circuitry, coil interface circuitry, control circuitry, and the sensor are integrated into a single integrated circuit product.

Automatic apparatus is provided in accordance with further aspects of the disclosure for degaussing a magnetic core, including a sensor interface receiving a signal from a sensor proximate the core and providing an output signal indicating the core magnetization, as well as a coil interface circuit and a control circuit to apply a signal of a first polarity to the compensation coil and to monitor and compare the measured core magnetization with a corresponding threshold in a closed loop, and once the threshold has been met, to provide an opposite magnetization signal until a second threshold is reached, such as zero. In certain embodiments, a second continuous signal may be applied in an opposite second polarity following magnetization to the first threshold, and the control circuit begins the pulsed degaussing after the measured magnetization meets the second threshold. By these techniques, the total degaussing time may be reduced, with the successive approximation or other closed loop feedback algorithm being applied in automated fashion.

Further aspects of the disclosure relate to closed loop methods for automatically degaussing a magnetic core. The method includes applying pulses to a compensation coil magnetically coupled with the core, as well as automatically controlling the pulse energy in a closed-loop fashion according to a discrete feedback algorithm, and automatically controlling the polarity of a given pulse at least partially according to a magnetization polarity of the core measured while substantially no current is flowing in the compensation coil during a period of time following the immediately preceding pulse.

Certain embodiments of the method involves applying pulses in a plurality of pulse cycles including measuring the core magnetization polarity while both ends of the compensation coil are connected together and substantially no current flows in the compensation coil, and applying a pulse to the compensation coil having a polarity opposite to the measured magnetization polarity, and an energy less than that of an immediately preceding pulse. In certain implementations, moreover, an initial or first pulse is applied before measuring the core magnetization polarity.

In certain embodiments, the method includes connecting both ends of the compensation coil together and measuring the core magnetization polarity and magnetization magnitude before applying the pulses, and applying an initial pulse with a polarity opposite to the measured magnetization polarity and a pulse energy determined according to the measured magnetization magnitude of the core.

In various embodiments, the method may further comprise automatically controlling the energy of individual pulses to be less than the energy of the immediately preceding pulse according to the discrete feedback algorithm.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
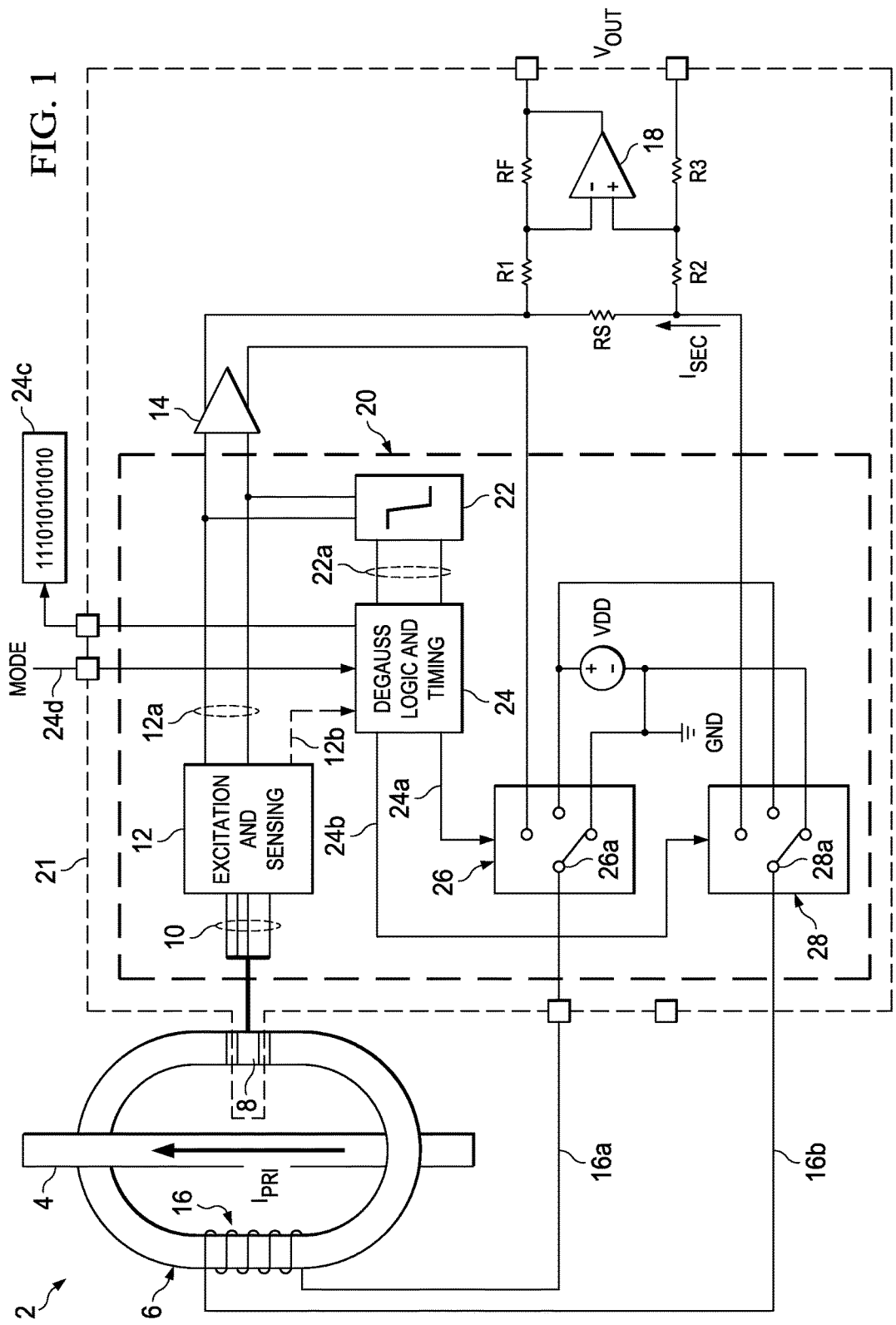
FIG. 1 is a schematic diagram illustrating an exemplary closed loop current sensor system with integrated closed loop automatic degaussing apparatus in accordance with one or more aspects of the present disclosure.

One or more embodiments or implementations are hereinafter described in conjunction with the drawings, wherein like reference numerals are used to refer to like elements throughout, and wherein the various features are not necessarily drawn to scale.

FIG. 1 illustrates an exemplary closed loop current sensor 2 operative to measure a primary current $I_{PRI}$ flowing in a primary coil or winding 4 magnetically interacting with a magnetic core 6. The primary coil 4 can be magnetically interfaced with the core 6 in any suitable fashion, and may be a single electrical conductor passing through the core 6, or can be a winding with one or more turns encircling portions of the core 6, or other suitable magnetic interaction configuration by which the current $I_{PRI}$ flowing in the coil 4 affects the magnetic flux in the core 6. A magnetic sensor 8 is operatively disposed proximate the core 6, for example, within a gap in the core material 6 in the example illustrated in FIG. 1. Any suitable magnetic sensor 8 can be used, including without limitation to fluxgate sensors, Hall effect sensors, etc., which provides one or more signals or values indicative of a magnetic condition of the core 6. Moreover, the sensor 8 preferably provides an output indicating a magnetization polarity of the core 6, and in certain implementations provides a magnetization magnitude or amplitude output, where the sensor 8 may provide a single signal from which both magnetization polarity and magnitude can be ascertained.

One or more electrical connections 10 are provided to interface the sensor 8 with an automatic degaussing apparatus 20, including sensor interface circuitry 12 and 22 with excitation and sensing circuitry 12 providing a differential output signal 12a and a comparator 22 providing a differential comparator output 22a in the illustrated example, although single ended signals 12a and 22a can be used. The comparator output 22a is provided as an input to control circuitry 24, in this case providing degauss logic and timing control to operate coil interface circuitry 26, 28 in a degaussing mode for selective provision of degaussing pulses to the core 6 via a compensation or secondary coil 16 in an automatic closed-loop fashion. The control circuitry 24 can be any suitable logic, processing components, electronic memory analog circuitry, or combinations thereof configured or otherwise adapted to perform the function set forth herein. As seen in FIG. 1, the exemplary coil interface circuitry 26, 28 includes first and second outputs 26a and 28a which are coupled with the first and second ends of the compensation coil 16 via leads 16a and 16b. In certain embodiments, the sensor interface circuitry 12, 22 the coil interface circuitry 26 and 28, the control circuitry 24, and the sensor 8 are constructed or otherwise fabricated in a single integrated circuit 21. In one possible example, the sensor 8 is a fluxgate sensor with a core structure fabricated on and/or in a semiconductor substrate with suitable excitation and sense coil windings formed as conductive structures at least partially encircling the core structure, and the excitation and sensing circuitry 12 includes suitable circuitry for providing excitation AC waveform to one or more excitation coils of the sensor 8 via the connections 10. The circuit 12 in such embodiments further includes sensing circuitry with any suitable rectification or demodulation circuitry and suitable integrator or other filtering circuits by which an output signal 12a is provided which indicates or otherwise represents the external magnetic field proximate the sensor 8. As discussed further below, moreover, certain implementations may employ a driver circuit 14 used for closed-loop current sensing in lieu of separate coil interface circuitry 26, 28, where the driver circuitry 14 is also fabricated together with the degaussing apparatus 20 and the sensor 8 in a single integrated circuit product.

Figure 8:
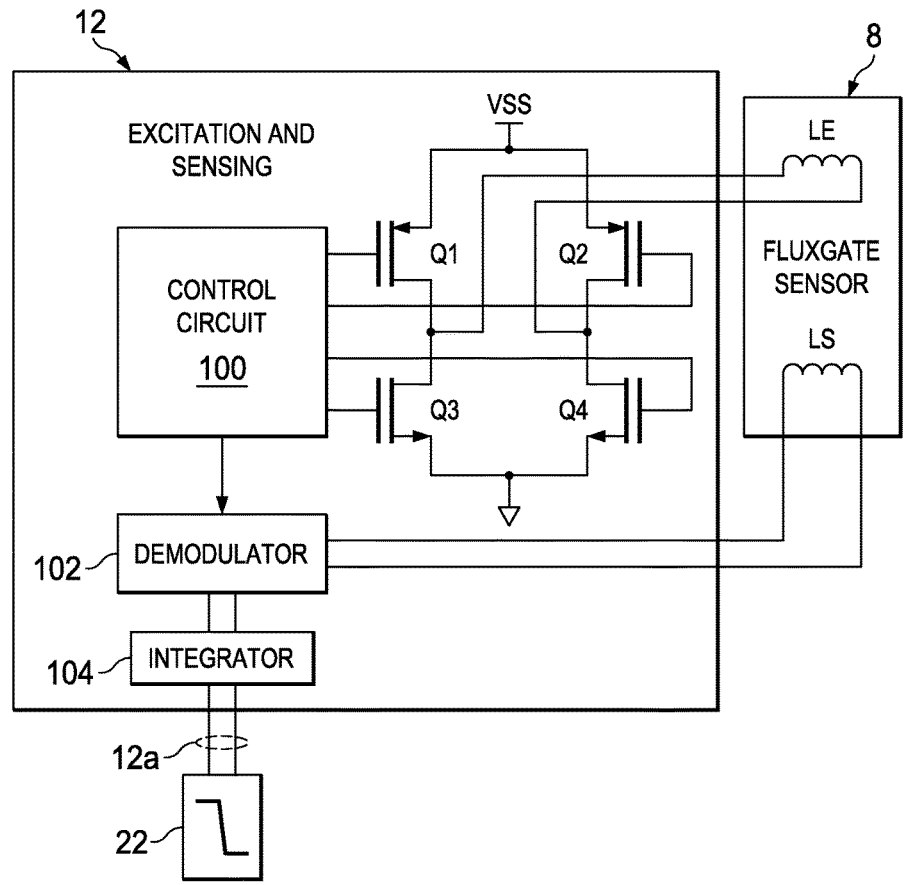
FIG. 8 is a schematic diagram illustrating an exemplary excitation and sensing circuit to interface a fluxgate magnetic sensor in the closed loop current sensor system of FIG. 1.
Figure 9:
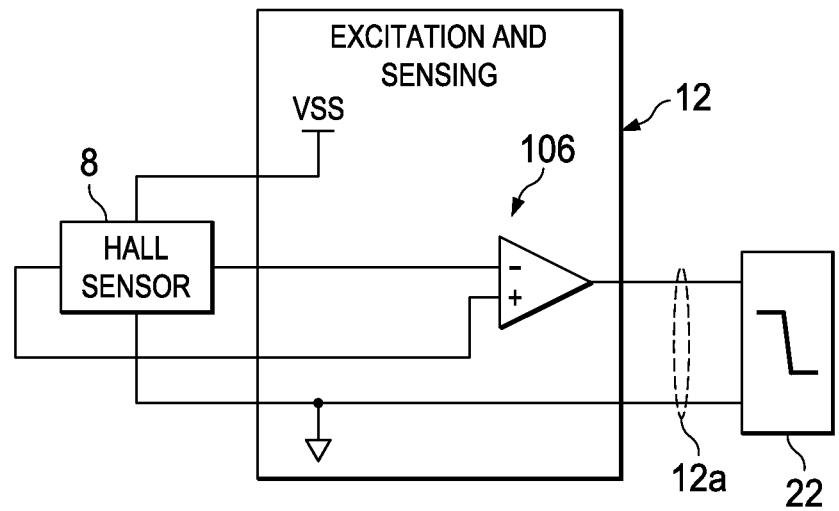
FIG. 9 is a schematic diagram illustrating an exemplary hall sensor excitation and sensing circuit in the closed loop current sensor system of FIG. 1.

Referring briefly to FIGS. 8 and 9, the degaussing apparatus 20 may include any suitable excitation and sensing circuitry 12 providing a sensor interface for use with a given magnetic sensor 8. In two non-limiting examples, the interface circuit 12 may provide for operative coupling with a fluxgate type magnetic sensor 8, or with a Hall effect sensor 8. FIG. 8 illustrates an exemplary excitation and sensing circuit 12 operable to interface with a fluxgate sensor 8 having an excitation winding LE and a sense winding LS. This embodiment 12 includes a control circuit 100 operating an H bridge excitation circuit including PMOS transistors Q1 and Q2 and lower NMOS transistors Q3 and Q4 for selective excitation of the excitation winding LE by providing pulses having a magnitude equal to a supply voltage VSS. In addition, the interface circuitry 12 includes a demodulator circuit 102 connected to the sense coil of the fluxgate sensor 8, as well as an integrator 104 receiving the demodulator output and providing the differential output signal 12a to the comparator 22. FIG. 9 illustrates another embodiment for interfacing with a hall sensor 8, where the excitation and sensing circuitry 12 provides connections for a positive voltage VSS and ground to the sensor 8, as well as a differential amplifier circuit 106 receiving a differential signal from two additional leads of the hall sensor 8 and providing the differential voltage output 12a to the comparator 22. In each of these examples, the differential output signal 12a is received by the comparator 22, which provides a comparator output indicating the magnetization polarity of the core 6. Moreover, in certain embodiments, the sensor interface circuitry 12 is configured to provide the output signal 12a (or a separate signal 12b as seen in FIG. 1) to the control circuitry 24 indicating a magnetization magnitude of the core 6. The magnetization magnitude can be indicated to the control circuitry 24 by any suitable signal or value representing the amount of magnetization in the core 6 at the time of the measurement by the sensor 8.

Returning again to FIG. 1, the degaussing apparatus 20 in the illustrated embodiment provides automatic on-board degaussing or demagnetization for the core 6 as part of a closed-loop current sensing system 2. Other embodiments of the automatic degaussing apparatus 20 are possible, which constitute separate systems or circuitry coupleable to the secondary coil 16 via coupleable outputs 26a and 28a, and including connections for one or more magnetic sensor leads 10. The current sensing system 2 is operable in a current sensing mode with the excitation and sensing circuitry 12 providing the differential output 12a to a driver circuit 14 which in turn provides pulse width modulated AC secondary current flow $I_{SEC}$ to the secondary or compensation coil 16 via the coil interface circuitry 26, 28 and secondary or compensation coil leads 16a and 16b according to feedback from the magnetic sensor 8. During such current sensing mode operation, the driver circuit 14 regulates the secondary current $I_{SEC}$ in a manner that reduces the sensor output to zero, whereby the value of the secondary current $I_{SEC}$ is proportional to the primary current flow $I_{PRI}$ flowing in the primary coil 4. The system 2 also includes a differential amplifier circuit with an op amp 18 configured via resistors R1-R3 and a feedback resistor RF to sense a voltage across a sense resistor RS connected in series with the compensation coil 16. The differential amplifier circuit provides an output voltage $V_{OUT}$ having a value proportional to the secondary current, which in turn is proportional to the primary current $I_{PRI}$ flowing in the primary inductor or winding 4 by closed-loop operation of the driver circuit 14. Other implementations are possible, for example, with the differential amplifier circuit being replaced by an analog-to-digital converter, or other suitable circuitry.

The control circuitry 24 in the illustrated example provides switch control signals 24a and 24b to operate switching circuitry 26 and 28 of the coil interface circuit according to a mode control signal or value 24d (MODE) for selective operation in either the closed-loop current sensing mode or the degaussing or demagnetization mode. In one possible implementation, the control circuitry 24 is configured such that if the MODE signal 24d is continuously one stage (e.g., high), automatic degaussing operation will be initiated during startup, with the control circuit 24 entering degauss mode, finishing degaussing, and then switching control internally to the closed loop signal path for current sensing operation thereafter until a subsequent startup operation. In the illustrated example, the switches 26 and 28 are set to the upper position for closed-loop current sensing operation to connect the outputs of the driver circuit 14 to the compensation coil leads 16a and 16b for operation as described above. In this configuration, the driver circuit 14 regulates the compensation or secondary coil current $I_{SEC}$ to cancel the magnetic effect in the core 6 associated with the primary current $I_{PRI}$ flowing in the primary coil 4, for example, to drive the output of magnetic sensor 8 to zero or to some other predetermined value, where the closed loop current sensing circuitry may be calibrated to accommodate any electrical offsets, etc.

In the degaussing or demagnetizing mode, the control circuitry 24 selectively controls the individual switching circuits 26 and 28 to connect the corresponding output 26a, 28a to a pulse voltage supply node VDD (corresponding switch in the middle position as shown in the figure) or to a common node GND (corresponding switch in the lower position). The illustrated switching circuits 26, 28 are operable in the degaussing mode to effectively couple the secondary coil leads 16a and 16b individually to be at the same voltage or to provide either a positive or negative voltage across the leads 16a and 16b. Consequently, in closed-loop current sensing applications, the coil interface circuitry features for degaussing mode operation as described herein could alternatively be provided by the driver circuit 14. A degaussing operation in the illustrated example is implemented by the control circuitry 24 by providing a plurality or series of pulses in a corresponding set of pulse cycles, with individual pulse cycles including a first state (pulse application) and a second state (measurement). In the first state, the control circuitry 24 connects a given one of the first and second outputs 26a, 28a to the pulse voltage supply node VDD and concurrently connects the other output to the common node GND, and in the second state connects both of the interface circuitry outputs 26a, 28a to the same potential, e.g., to the common node GND.

For some or all of the pulse cycles of a degaussing operation, moreover, the control circuitry 24 selects or chooses the given output 26a, 28a which is to be connected to the supply node VDD according to the magnetization polarity indicated by the most recent measurement obtained from the sensor 8 in the excitation and sensing circuitry 12, as indicated by the state of the comparator output 22a. In this regard, the degauss logic and timing control circuitry 24 ascertains the polarity of the current core magnetization based on the state of the comparator output 22a, and is configured to choose one of the outputs 26a or 28a which should be connected to the positive supply voltage VDD (e.g., 5V in one example) in order to change the magnetization of the core 6 in a direction opposite to the most recently measured magnetization polarity of the core 6. In this manner, the control circuitry 24 controls the polarity of the individual pulses to oppose a measured magnetization of the core 6, thus facilitating demagnetization or reduction in the amount of magnetization currently present in the core 6.

In addition, the control circuitry 24 controls the energy of the individual pulses provided during degaussing based on a discreet feedback algorithm, such as a successive approximation technique as described further below. In the illustrated example, for instance, the energy of the applied pulses can be controlled by controlling the duration of the first state in successive pulse cycles, and the control circuitry 24 in certain embodiments controls the duration $T_N$ in the first state for successive pulse cycles to be less than the duration $T_{N-1}$ of the first state in an immediately preceding pulse cycle. This technique, in combination with the pulse polarity determination based on feedback, provides for successive approximation of the amount and direction of degaussing pulses in order to drive the core magnetization toward zero, whereby the control circuitry 24 implements a closed loop discreet feedback algorithm. Binary implementations are possible, similar to successive approximation register analog-to-digital conversion techniques, with the duration (and hence the energy) of the succeeding pulse being approximately half that of the preceding pulse. However, the inventors have appreciated that particular advantages are facilitated by setting the duration $T_N$ of the first state in successive pulse cycles to be greater than half the duration $T_{N-1}$ used in the preceding cycle (e.g., $T_{N-1} > T_N > 0.5\ T_{N-1}$), where a duration value $T_N$ of approximately 0.75 $T_{N-1}$ may be used in certain implementations.

The inventors have appreciated that open loop demagnetizing techniques, whether automated or not, may reduce the magnetization of a magnetically susceptible material, but are not ensured to take the core magnetization to zero. In particular, alternating pulses of either increasing frequency or decreasing amplitude have previously been used in open loop fashion, but this does not guarantee that the final core magnetization will be significantly improved. In a closed loop current sensing application, moreover, magnetization of the core 6 causes a magnetic offset in the system operation, leading to an offset error in the output voltage $V_{OUT}$ and hence a limitation on the accuracy of the overall system in measuring or assessing the amount of primary current flow $I_{PRI}$ in the primary conductor 4. The use of a closed-loop discreet feedback algorithm and the magnetization polarity information obtained via the sensor 8, the circuitry 12 and the comparator 22 facilitates expeditious reduction in the magnetization condition of the core 6, and provides a closed-loop path to drive the magnetization successively lower, and thus facilitates better results in less time than the conventional open loop degaussing techniques.

In addition to controlling the duration of the applied pulses, the control circuitry 24 in certain embodiments also controls the duration of the second state in the individual pulse cycles. In particular, the control circuit 24 is configured to maintain operation in the second state (with the two ends of the compensation coil 16 connected together) for a sufficient time to allow current flow in the compensation coil 16 to be zero or substantially zero before assessing the comparator output 22a. Thus, the selection of the given one of the outputs 26a, 28a to which the positive voltage VDD is to be applied for the succeeding first state is done based on a measurement when there is substantially no secondary current. Furthermore, it will be appreciated that it is preferred that no primary current $I_{PRI}$ be flowing in the primary conductor 4 when the magnetization of the core 6 is measured via the sensor 8. In this regard, a host system may control the timing of the switching of the control circuitry 24 into the degaussing or demagnetization mode, and thus may ensure that no primary current is flowing in the primary conductor 4 during this mode of operation. In this regard, the control circuitry 24 in certain embodiments is operable upon request via the signal 24d to switch between the close loop current sensing mode operation and the degaussing mode operation, and the apparatus 20 may further be configured to implement a degaussing or demagnetization operation upon power up, with the host system being configured to ensure that the primary current $I_{PRI}$ is essentially zero for a certain amount of time at power up in order to facilitate the degaussing operation. In this regard, various implementations of the disclosed degaussing operation may be implemented rather quickly, such as tens of milliseconds, etc., this facilitating timely power up of a host system while implementing power up degaussing.

In addition, as seen in FIG. 1, the illustrated control circuitry 24 in certain embodiments provides a Boolean code 24c representing polarities of the individual pulses applied to the core 6 during a degaussing operation. In various implementations, moreover, the control circuitry 24 operates to provide a series or plurality of pulses in corresponding pulse cycles of a given degaussing operation, and may terminate or discontinue causing the coil interface circuitry 26, 28 to apply the pulses to the core 6 when a predetermined termination condition has been met. In one possible example, the control circuitry 24 is configured to implement a predetermined number of iterations of pulses, for example, 12 pulses, and to report or provide a Boolean code 24c with the "1" and "0" values respectively indicating provision of positive and negative pulses during the degaussing operation. The host system may thus use the code 24c to assess or estimate the magnetic condition of the core 6 prior to degaussing, since the code 24c represents the degaussing needed to bring the magnetic condition of the core 6 closer to the ideal state. Furthermore, certain implementations of the degaussing apparatus 20 and degaussing methods as detailed further below may utilize the code 24c from a previous degaussing operation as a value to estimate the initial condition of the core 6, and accordingly tailor the upcoming degaussing operation according to the code 24c, potentially reducing the amount of time expended in the subsequent degaussing operation.

Figure 2:
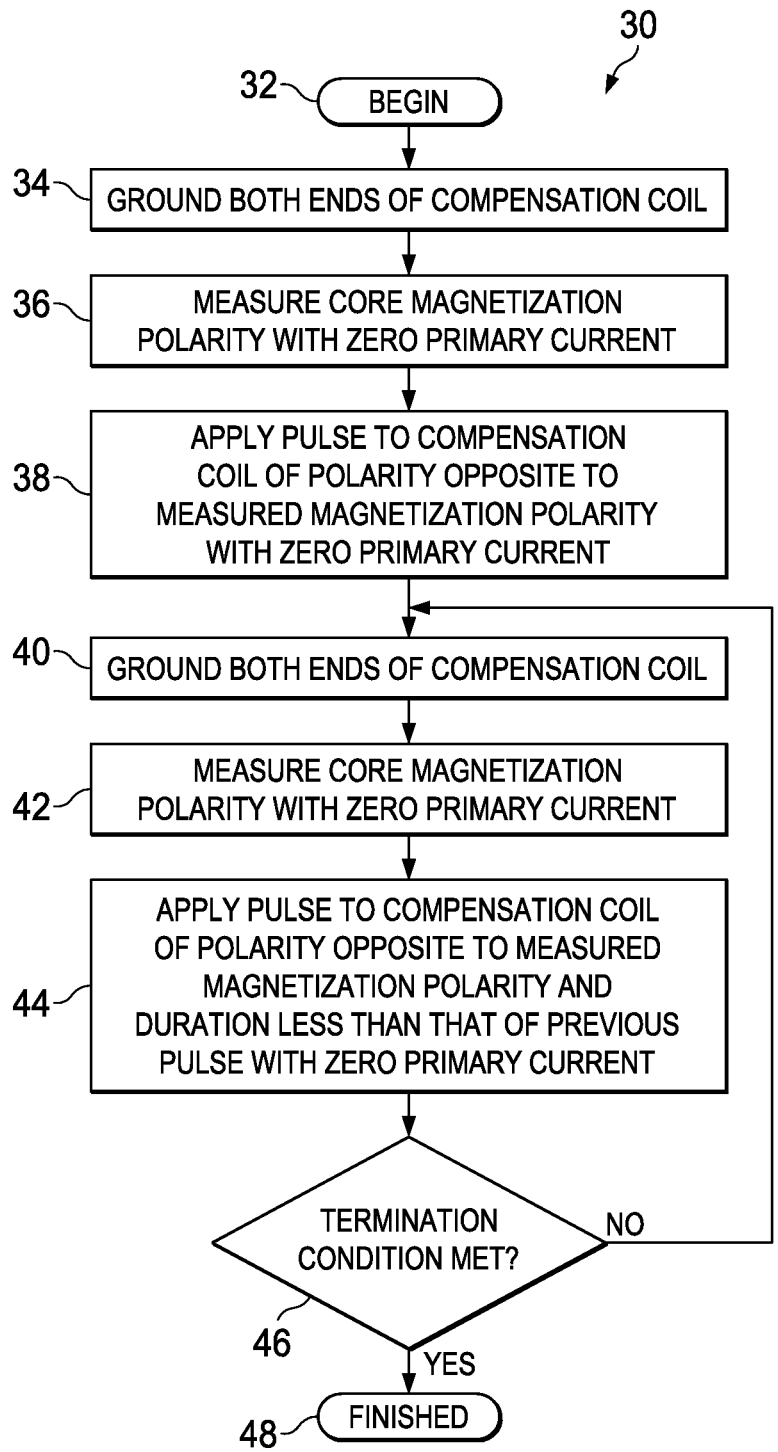
FIG. 2 is a flow diagram illustrating a first exemplary method for automatic closed loop degaussing in accordance with the present disclosure.

FIG. 2 illustrates a method or process 30 for automatically degaussing a magnetic core, such as the core 6 of FIG. 1, in which pulses are applied to a compensation coil 16 to facilitate at least partial demagnetization, and the energy of at least some of the pulses is controlled in a closed-loop fashion according to a discreet feedback algorithm. Moreover, the method 30 provides for automatic control of the polarity of given individual pulses at least in part according to the magnetization polarity of the core 6 measured during the period of time following the immediately preceding pulse while substantially no current flows in the compensation coil 16. In certain embodiments, the control circuitry 24 operates generally according to the process 30, or the processes 50 and 70 illustrated and described below in connection with FIGS. 3 and 4.

The method 30 of FIG. 2 advantageously measures the initial core magnetization prior to applying a first pulse, and selectively determines the polarity of the initial demagnetization pulse according to the measured core magnetization polarity. Beginning at 32 in FIG. 2, the method 30 provides for connecting both ends of the compensation coil 16 together, for example by grounding both ends of the compensation coil at 34. In one implementation, the control circuitry 24 provides the switching control signal 24a to cause the switching circuit 26 to connect the first output 26a to the ground or common terminal GND, and provides the signal 24b to cause the switching circuit 28 to likewise connect the second output 28a to GND at 34 in FIG. 2. The magnetization polarity of the core 6 is measured at 36, for example, based on the output of the magnetic sensor 8, with the exemplary excitation and sensing circuit 12 and the comparator 22 providing the comparator output signal 22a indicating the polarity of the magnetization of the core 6 while the compensation coil ends are connected together, preferably with zero primary current $I_{PRI}$ flowing in the primary conductor 4. In certain embodiments, moreover, the control circuit 24 controls the timing of the measurement at 36 such that sufficient time has passed since the compensation coil ends were connected together at 34 to ensure that substantially zero current is flowing in the compensation core 16 when the measurement is taken at 36.

Based on the measured core magnetization polarity, the control circuitry 24 causes the coil interface circuitry 26, 28 to apply a pulse to the compensation coil 16 at 38 in FIG. 2 of a polarity opposite to the measured magnetization polarity, preferably with zero primary current $I_{PRI}$ flowing in the primary conductor 4. In the embodiment of FIG. 1, the control circuit 24 applies the pulse by switching a given one of the circuits 26, 28 to connect the corresponding output 26a, 28a to the supply voltage VDD and maintaining connection of the other output to the common node GND, with the degaussing logic and timing control circuit 24 selecting the given one of the circuits 26, 28 according to the immediately preceding core magnetization polarity measurement obtained at 36. In one possible implementation, the control circuitry 24 controls the duration of the first stage to apply the pulse at 38 according to a predetermined initial pulse duration value, for instance, 20 ms. In this manner, an initial pulse of a predetermined energy is applied at 38, having a polarity selected to reduce the preceding core magnetization state.

Following the initial pulse at 38, both ends of the compensation coil are again grounded at 40, and the core magnetization polarity is measured at 42, preferably with zero primary current flow $I_{PRI}$. A pulse is then applied at 44 to the core 6 via the compensation coil 16, with the control circuitry 24 controlling the pulse polarity by selecting which of the circuits 26, 28 will connect its output to VDD via the corresponding control signals 24a and 24b based on the polarity of the most recent magnetization measurement indicated by the comparator output 22a. In addition, the duration of the pulse applied at 44 is controlled by the control circuitry 24 to be less than that of the previous pulse, and is preferably greater than half the duration of the previous pulse in certain implementations.

A determination is made by the control circuitry 24 at 46 in FIG. 2 as to whether a predefined termination condition has been met. For example, the controller may implement a predefined number of pulse applications (e.g., 12 in one non-limiting implementation), and once applied (YES at 46), the control circuitry 24 finishes the degaussing operation 30 at 48 in FIG. 2. In another example, the control circuitry 24 may assess a magnitude associated with the output signal 12a (or signal 12b in FIG. 1) from the excitation and sensing circuitry 12, and if the magnetization magnitude is determined to be less than a predetermined threshold (e.g., indicating that the current core magnetization level is sufficiently close to zero), the control circuitry 24 finishes the degaussing process 30 at 48. These and/or other terminations can be used in various embodiments, alone or in combination.

In certain embodiments, moreover, the control circuitry 24 stores a digital (Boolean) code 24c (FIG. 1) in an internal register, and provides this as an output after completion of the degaussing process at 48. The code 24c in certain embodiments is a Boolean code representing the polarities of the individual pulses applied to the core 6 (e.g., at 44 in FIG. 2) during the degaussing process 30. In the example of FIG. 1, the most significant bit or MSB (the bit on the left in the figure) represents the polarity of the first pulse applied at 38 in FIG. 2, and thus indicates that a positive first pulse was applied, according to an immediately preceding comparator output signal 22a indicating an initial negative direction magnetization of the core 6 based on the reading from the magnetic sensor 8. Proceeding in the code 24c of FIG. 1, the next two bits are both "1", thus indicating that the first three pulses were applied in the same (e.g., positive) direction, and the remaining bits in the code 24c indicate the respective polarities of the succeeding pulses. In this example, moreover, the control circuitry 24 implements a 12-pulse degaussing operation, and thus outputs a 12 bit corresponding code 24c. In certain implementations, moreover, the control circuitry 24 may output the code 24c having a fixed number of bits, even though the represented degaussing operation may have involved more than that fixed number of pulses.

If the termination condition has not been met (NO at 46 in FIG. 2), the process 30 returns to again connect the compensation coil ends together at 40, measure the core magnetization polarity at 42, and apply another pulse at 44. In this in successive cycles, the pulse polarity is again controlled according to the magnetization polarity measured during the time while the compensation coil current is zero after the preceding pulse was applied, thereby ensuring that the next degaussing pulse is of a polarity that tends to change the core magnetization in a direction opposite to the present magnetization polarity. As discussed further below in connection with FIGS. 5-7, it is noted that the process 30 of FIG. 2 uses closed-loop operation to pulse the compensation coil 16 in a direction that is based on the immediately preceding magnetization polarity measurement, and will thus tend to converge the magnetization of the core 6 toward zero faster than conventional open loop techniques in which the pulse polarity was alternated every cycle, and the method 30 may in certain cases (e.g., FIG. 6 below) provide several pulses in sequence of the same polarity, depending on the magnetization state of the core 6.

Figure 3:
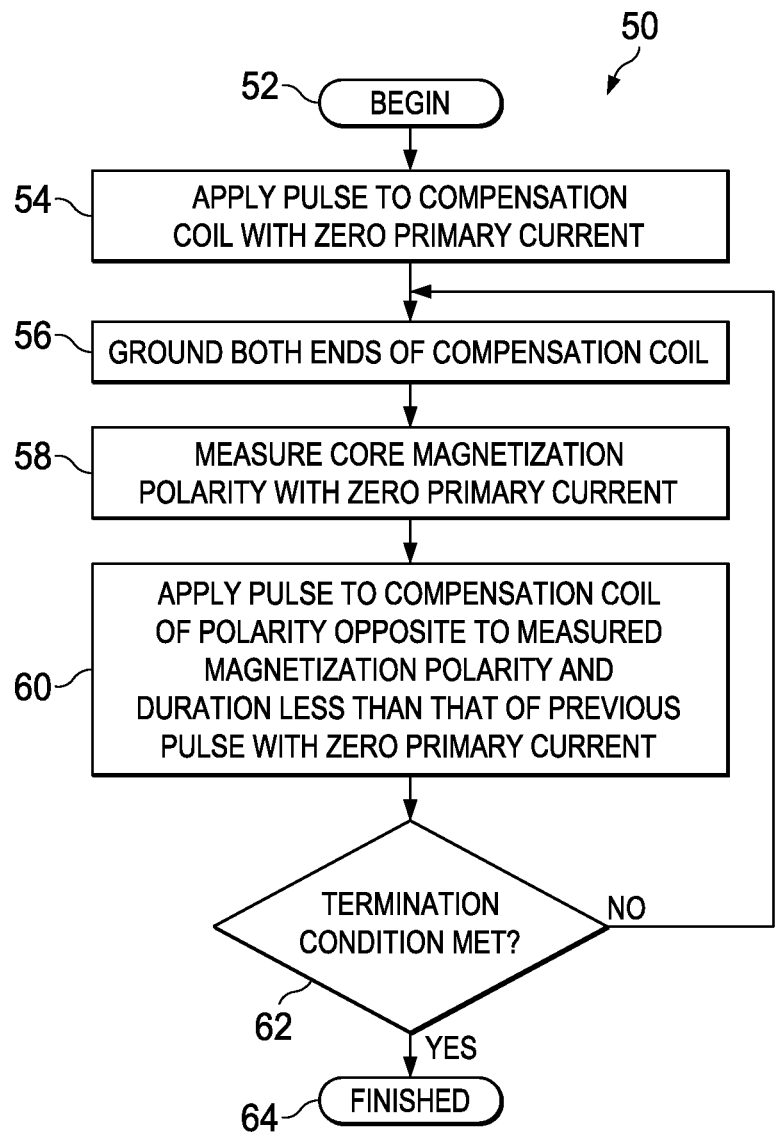
FIG. 3 is a flow diagram illustrating a second exemplary method for automatic closed loop degaussing according to the disclosure.

FIG. 3 illustrates another embodiment of a degaussing method or process 50, beginning at 52. In this example, unlike that of FIG. 2, the control circuitry 24 applies the first pulse at 54 to the compensation coil 16 without previously measuring the magnetization polarity (or magnitude) of the core 6. In certain embodiments, the polarity of the initial pulse applied at 54 can be a predetermined value, or the control circuitry 24 may randomly select the polarity for the initial pulse in other embodiments. At 56 in FIG. 3, the control circuitry 24 causes the coil interface circuitry 26, 28 to connect both ends of the compensation coil 16 to one another (e.g., by grounding both compensation coil leads 16a and 16b in the illustrated example), and measures the core magnetization polarity at 58 using the sensor interface circuitry 12, 22 as described above. The control circuitry 24 then applies a pulse to the compensation coil 16 at 60 in FIG. 3 of a polarity opposite to the measured magnetization polarity, with a duration less than that of the pulse applied previously at 54. The control circuitry 24 then determines at 60 whether a termination condition has been met, and if not (NO at 62) returns to again measure the magnetization polarity at 58 with the compensation coil ends connected at 56, and provides the next pulse at 60 with the polarity determined according to the preceding measurement with the energy (e.g., duration) being less than that of the preceding pulse. Once the termination condition has been met (YES at 62), the control circuitry 24 finishes the degaussing process 50 at 64, and may optionally output an code 24c as described above.

Figure 4:
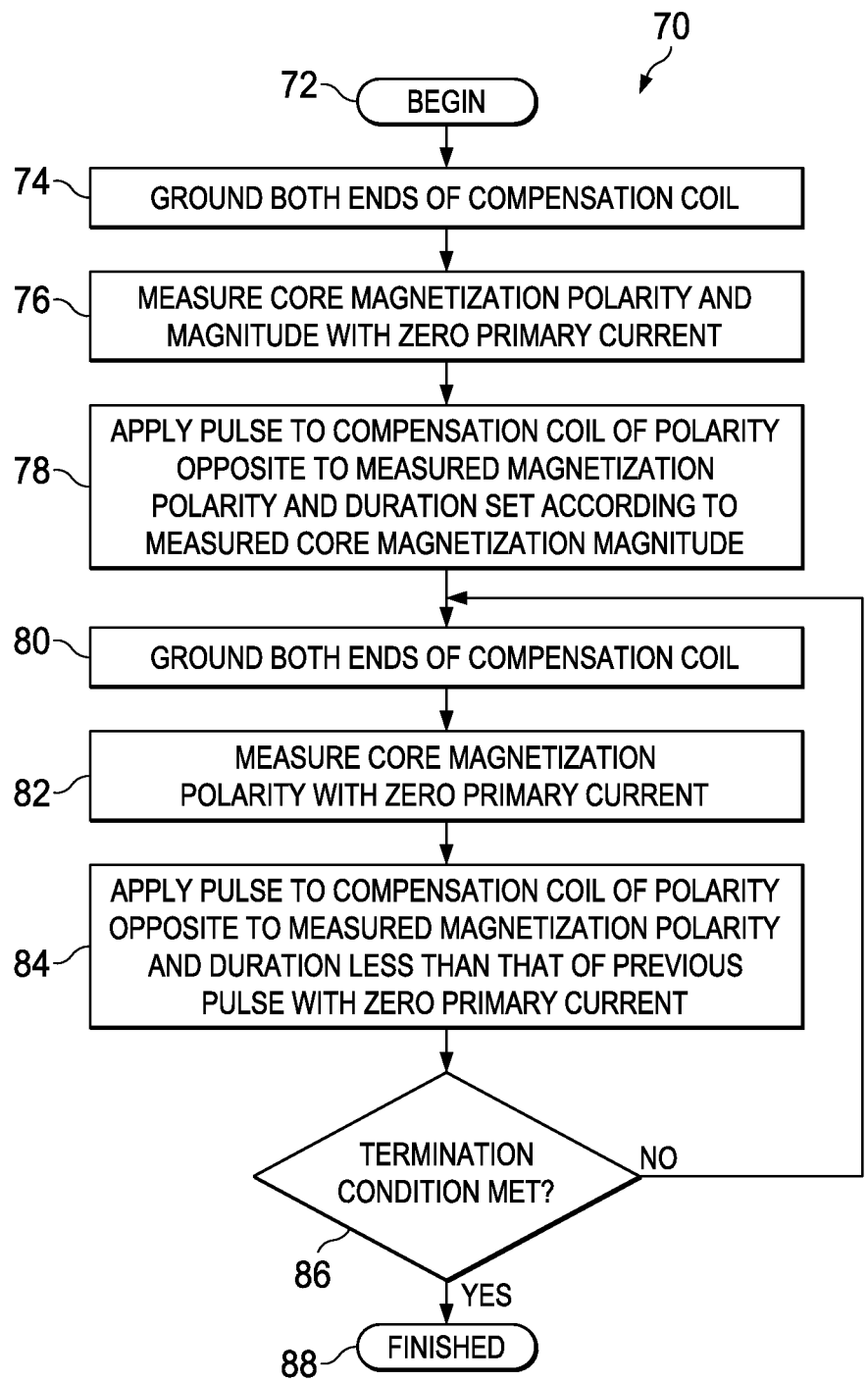
FIG. 4 is a flow diagram illustrating a third exemplary method for automatic closed loop degaussing.

FIG. 4 illustrates another non-limiting example of a degaussing process 70 which can be implemented via the control circuitry 24 of FIG. 1. In this case, the process begins at 72 and the control circuitry 24 causes both ends of the compensation coil 16 to be connected at 74. At 76, however, the control circuitry utilizes the sensor interface circuitry 12, 22 to measure both the core magnetization polarity (e.g., via the output of the comparator 22) as well as a magnetization magnitude or amplitude (e.g., via the output 12a of the excitation and sensing circuitry 12 or the signal 12b in FIG. 1). One possible technique for measuring the magnetization magnitude at 76 includes driving the coil 16 until a certain threshold is crossed, with the magnitude being calculated according to the duration of the driving signal. Another possible technique is the use of a linear magnetic sensor with an output corresponding to the sensed magnetic field amplitude. In one possible implementation, the control circuitry 24 assesses a continuous magnitude value of the output signal 12a from the excitation and sensing circuitry 12, and then applies the succeeding pulse to the compensation coil 16 at 78 of a polarity opposite to the measured magnetization polarity and with a duration set at least partially according to the measured core magnetization magnitude. In another non-limiting embodiment, the control circuitry 24 may utilize a window comparator to identify whether the output of the sensing circuitry 12a is within a first range or a second range, and accordingly set the duration of the initial pulse at 78 to be of a corresponding first or second predefined duration. Other embodiments are possible utilizing any suitable magnetization magnitude assessment and corresponding adjustment of the duration of the initial pulse applied at 78 in various embodiments.

The applicants have appreciated that the selective control of the initial pulse duration via the magnitude measurement at 76 and the pulse duration control at 78 advantageously facilitates shorter degaussing processing time. For example, if the initial magnetization condition of the core 6 is significantly far away from the zero condition, the pulse duration may be intelligently set in an automatic fashion by the control circuitry 24 at 78 in FIG. 4 in order to provide a pulse to the compensation coil 16 of a relatively high energy value, thereby expeditiously driving the core magnetization toward zero, potentially leading to fewer iterations required to meet a predetermined termination condition. In another example, if the initial magnetization condition of the core 6 is relatively close to zero at the beginning of the process 70, the control circuitry 24 can advantageously assess this magnetization magnitude at 78 and set the duration of the pulse at 78 (and thus the energy of the pulse applied to the compensation coil 16) to a relatively small value, thereby avoiding excessive number of iterations that overshoot the target value of zero magnetization. This intelligent closed-loop process 70 is thus significantly different from prior open loop techniques, in which the initial pulse energy was fixed, regardless of the initial magnetization state of a coil being degaussed.

The process 70 continues in FIG. 4 with the control circuitry 24 again causing the coil interface circuitry 26, 28 to connect both ends of the compensation coil 16 to one another at 80, and measuring the core magnetization polarity at 82 via the excitation and sensing circuitry 12 and the comparator 22 as described above. At 84, the control circuitry 24 applies the next pulse to the compensation coil 16 having a polarity opposite to the measured magnetization polarity, and with a duration less than that of the previous pulse. A determination is then made at 86 by the control circuitry 24 as to whether a predetermined termination condition has been met (e.g., a preset number of applied pulses, etc.), and if not (NO at 86), further measurements are taken and pulses are provided at 80-84 as previously described. Once the termination condition has been met (YES at 86), the control circuitry 24 completes the degaussing process at 88, and may optionally output a code 24*c* as described above.

In the illustrated close-loop current sensor system 2 of FIG. 1, it is noted that the automatic degaussing apparatus 20 operates in both a degaussing mode and a current sensing mode, based on the condition of the mode select input signal 24*d*. In certain embodiments, as discussed above, the control circuitry 24 may automatically initiate and perform a degaussing mode operation upon system power up, optionally reporting the code 24*c* to a host system, or otherwise making such a code 24*c* available to a host system. Thereafter, the host system may assert the mode select signal 24*d* as desired in order to initiate another degaussing operation via the apparatus 20. In certain implementations, moreover, the control circuitry 24 may advantageously store the code 24*c*, and selectively control the duration of the initially applied pulse at least partially according to the code 24*c* corresponding to a previous degaussing operation. In this manner, the apparatus 20 advantageously facilitates inferential learning of, and adaptation to, magnetizing conditions in a given application, and may thus facilitate improved and/or quicker degaussing by beginning the demagnetization processing with a pulse of energy and/or polarity set according to the best estimate of an expected core magnetization. This further concept was not feasible using conventional open-loop degaussing techniques, as the end result of those processes did not yield any information or code indicative of the amount of demagnetization that was actually required for a given system.

Applicants have further appreciated that the use of the described or other discrete feedback algorithms advantageously makes the apparatus 20 suitable without customization for use with core structures 6 of a variety of different sizes and shapes and magnetic characteristics. In this regard, the selective control of the pulse energy, and the gradual reduction thereof by the described discrete feedback algorithms renders the system operable to address large and small amounts of initial magnetization for a given core 6, as well as for use with cores 6 that are relatively easy to degauss as well as cores that require more energy to degauss. In this regard, the illustrated examples employ temporal control of the duration of the first state of each pulse cycle in which the pulse is applied to the compensation core 16, and the algorithm will converge toward a given acceptable range of degaussing (e.g., acceptable range for a final magnetization value of the core 6) over time independent of the initial magnetization condition of the particular core 6 to which the apparatus 20 is connected.

As previously discussed, moreover, since the coil interface circuitry 26, 28 operates to selectively provide pulses of different polarities to the compensation coil 16, with intervening connection of the coil ends to one another, this function can be effectively implemented in closed-loop current sensing systems such as the system 2 of FIG. 1 in other embodiments, for example, with the switching circuitry 26, 28 being omitted, and the functions thereof being implemented using the driver circuitry 14 normally employed for closed-loop current sensing operation of the system 2, with the control circuitry 24 assessing the magnetization polarity via the output of the comparator 22, and providing suitable control signaling to operate the driver circuitry 14 in a degaussing mode, and to allow the normal closed-loop operation of the driver circuitry 14 in a normal current sensing mode.

Figure 5:
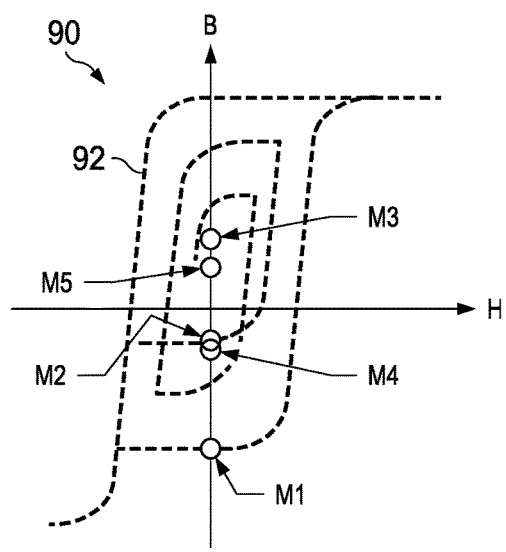
FIG. 5 is a graph illustrating an exemplary hysteresis curve for a magnetic current sensor core.
Figure 6:
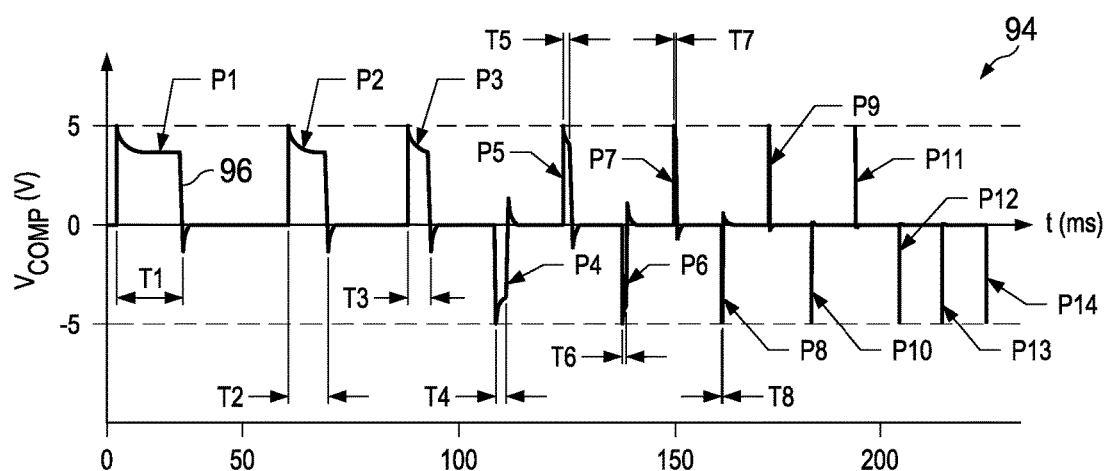
FIG. 6 is a graph illustrating exemplary degaussing voltage pulses applied to the compensation coil of the closed loop current sensor system.
Figure 7:
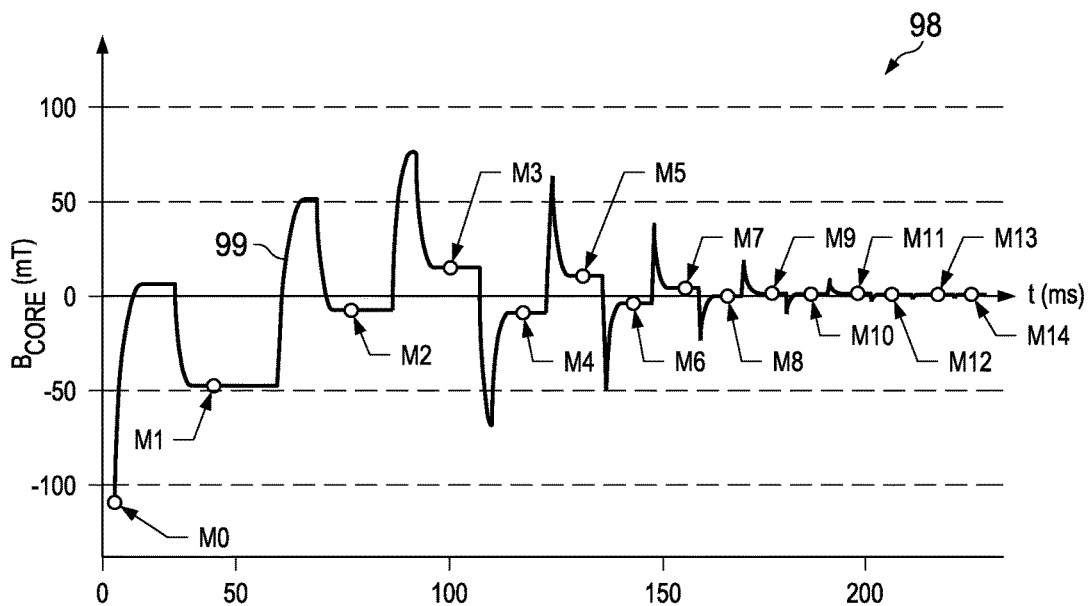
FIG. 7 is a graph illustrating exemplary sensor core magnetization amplitudes resulting from the degaussing voltage pulses of FIG. 6 in operation of the integrated closed loop automatic degaussing apparatus.

Referring also to FIGS. 5-7, an exemplary degaussing operation is illustrated, with FIG. 5 providing a graph 90 depicting magnetization transitions along a curve 92 with hysteresis for an exemplary core structure 6 in a vertical direction corresponding to flux density (e.g., "B" in units of Torr), and in a horizontal direction corresponding to magnetic field strength (e.g., "H" in units of Henries). The transitions in the graph 90 of FIG. 5 correspond with pulses applied as shown by the curve 96 in graph 94 of FIG. 6, with the corresponding magnetic flux curve 99 illustrated in the graph 98 of FIG. 7. In the example of FIGS. 5-7, for instance, the core 6 initially begins at a magnetization polarity (negative) and magnitude (e.g., approximately −108 mT) indicated as "M0" in FIGS. 5 and 7. Utilizing the above-described processing of FIG. 2, the control circuitry 24 initially measures the polarity of the magnetization state M0, in this case negative, and accordingly applies a positive first pulse P1 with a first state (on-time) duration T1 of approximately 20 ms as shown in FIG. 6 by selectively connecting the first end of the compensation coil 16 to the positive voltage VDD and by connecting the other end of the coil 16 to GND for the time period T1.

As seen in FIGS. 5 and 7, the application of this first pulse changes the core magnetization to a level M1 in the second state following removal of the voltage pulse P1. In this example, the magnetization state M1 is still negative, but closer to zero than was the initial state M0. Accordingly, the control circuitry 24 determines that the magnetization is still negative, and accordingly provides a subsequent positive pulse P2, having a duration T2 shorter than that of T1, and preferably greater than 50% of T1. Following the pulse P2, the resulting measurement at the magnetization state M2 again indicates a negative magnetization polarity, and the control circuitry 24 accordingly provides a third positive pulse P3, leading to the first indication of a positive magnetization measured at M3. The inventors have appreciated that strict binary reduction by 50% for each subsequent pulse may not correlate well with the non-linear relationship shown in the B-H curve 90 of FIG. 5, and thus providing each successive pulse having a duration $T_N$ (and hence an energy) less than the duration $T_{N-1}$ of the immediately preceding pulse, but greater than 0.5 $T_{N-1}$ provides for a fairly robust discrete feedback algorithm, utilizing the polarity measurements to determine the direction of the next applied pulse. For example, the first pulse P1 may be provided for a duration of approximately 20 ms, with the second pulse P2 in one implementation being provided for approximately 15 ms, etc. As seen in FIGS. 5-7, the degaussing processing proceeds with subsequent application of the remaining pulses P4-P14 with correspondingly decreasing first state (on-time) durations T4-T14 by which the magnetization condition of the core 6 is successfully reduced to or substantially to zero after a reasonable number of pulses.

Figure 12:
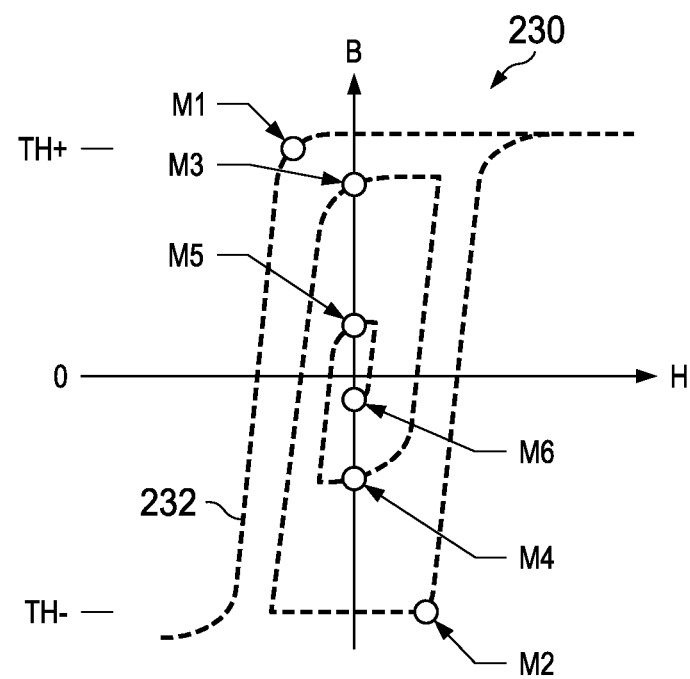
FIG. 12 is a graph illustrating exemplary sensor core magnetization amplitudes resulting from the degaussing operation of the integrated closed loop automatic degaussing apparatus of FIG. 10.
Figure 10:
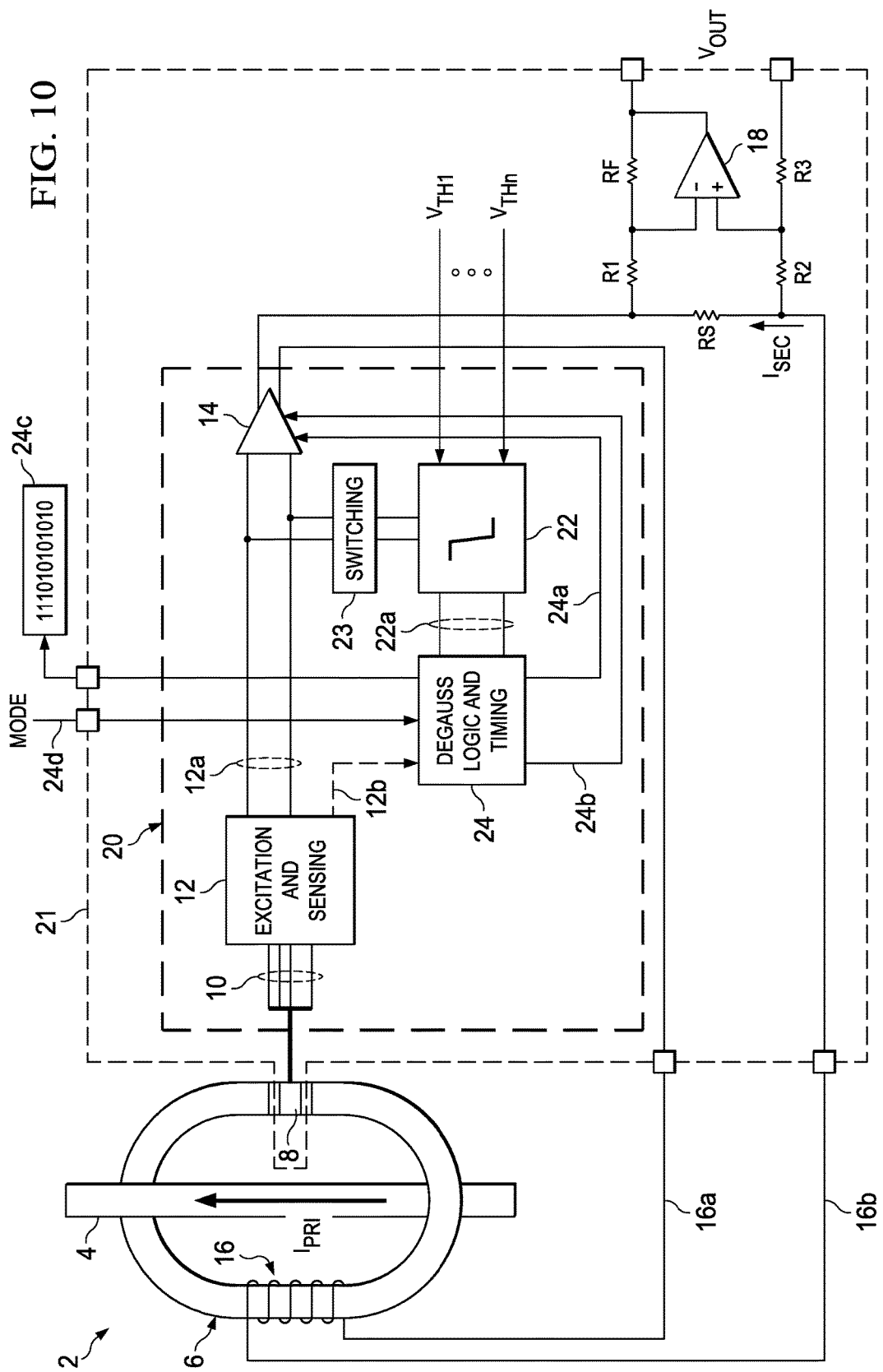
FIG. 10 is a schematic diagram illustrating another exemplary closed loop current sensor system with integrated closed loop automatic degaussing apparatus in accordance with the present disclosure.

Referring also to FIGS. 10-12, another exemplary closed loop current sensing system 2 is illustrated having a degaussing apparatus 20 in accordance with the present disclosure. In this case, as discussed above, the provision of pulses and other degaussing signaling to the compensation coil 16 is implemented using the driver circuit 14 in a degaussing mode, and the driver circuitry 14 is used in a normal closed-loop current sensing mode as well, with the operating mode of the driver circuit 14 being controlled by the degauss logic and timing control circuitry 24 via signals 24a and 24b as described above. In addition, the degaussing apparatus 20 in FIG. 10 may also include a switching circuit 23 operative to selectively switch the connections between the excitation and sensing circuit output lines 12a and the input to the comparator circuit 22 (e.g., to reverse the polarity of the signal applied to the comparator 22). In this manner, the degaussing apparatus 20 can use a single comparator circuit 22 in order to compare the sensor output signal 12a with a plurality of thresholds. For example, as seen in FIG. 10, circuitry 22 in certain embodiments may be provided with an integer number "n" threshold reference voltages, shown in this example as $V_{TH1}$ through $V_{THn}$ for, such as a first (e.g., positive) threshold (TH+ in FIG. 12), a zero voltage threshold, and a second or negative threshold (TH− in FIG. 12).

Figure 11A:
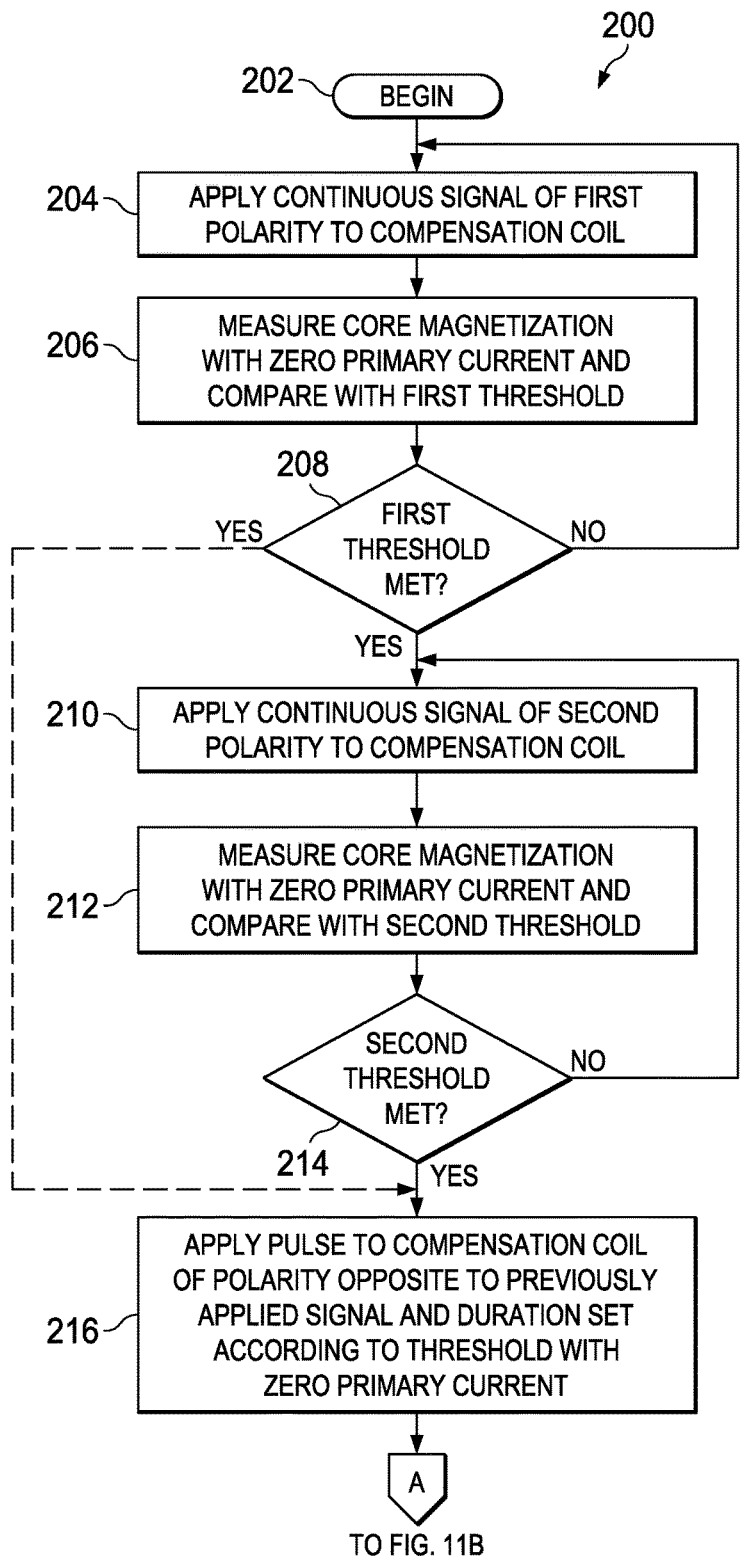
FIGS. 11A and 11B depict a flow diagram illustrating another exemplary method for automatic degaussing using closed-loop control of continuous signals followed by application of coil pulses according to further aspects of the disclosure.
Figure 11B:
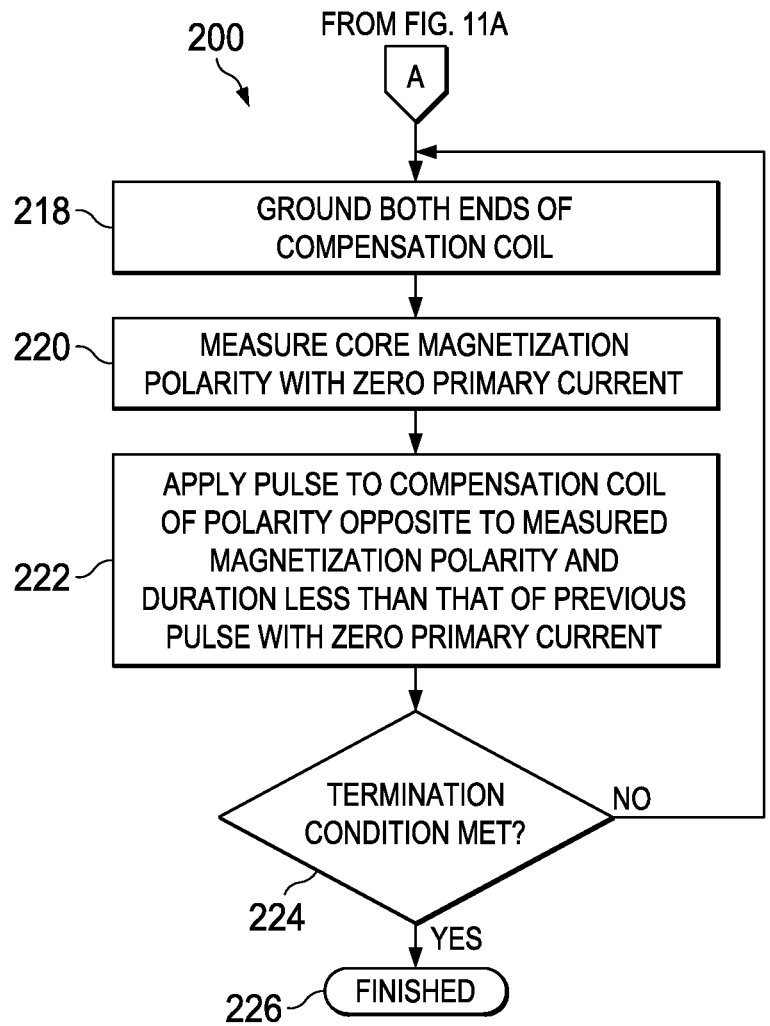

Referring also to the process 200 illustrated in FIGS. 11A-11B, the control circuitry 24 in certain embodiments can implement other forms of closed-loop degaussing at least partially according to the output of the sensor 8, for example, including continuous processes with signal application and monitoring in non-pulsed form, pulse-based discrete feedback algorithm type processes, or combinations thereof. In the process 200, moreover, the control circuitry 24 advantageously implements an initial continuous (e.g., non-discrete) feedback algorithm to perform coarse degaussing, followed by initiation of a discreet closed-loop (e.g., pulse-based) degaussing phase for more precise or "fine" degaussing. In this regard, the inventors have appreciated that the initial employment of one or more continuous signals while the core magnetization is measured and monitored via the sensor 8 and the comparator circuitry 22 can advantageously expedite an overall degaussing operation.

The illustrated process 200 begins at 202 in FIG. 11A, with the control circuit 24 applying a continuous signal of a first polarity to the compensation coil 16 at 204 in FIG. 11A, and with the core magnetization being measured at 206 (preferably with zero primary current $I_{PRI}$). The measured magnetization is compared in generally continuous fashion with a first threshold during application of the continuous first pulse. In this regard, the following discussion assumes that the first polarity is positive, and the corresponding first threshold is a positive magnetization threshold, although other embodiments are possible in which the initial or first polarity is selected to be negative, and the first threshold represents a negative direction magnetization of the core 6.

The control circuitry 24 makes a determination at 208 as to whether a first threshold has been met. As seen in a B-H graph 230 of FIG. 12, assuming the initial core magnetization was in a negative direction as in the previous example, and assuming the continuous signal is applied at 204 in a positive direction, the control circuitry 24 applies the signal at 204 and continuously monitors the output of the sensor 8 at 206 so long as the core magnetization measurement does not meet the first threshold TH− shown in FIG. 12 (NO at 208). During this continuous application of the signal at 204, 206 and 208, the core magnetization proceeds upward along a path 232 shown in dashed-line in FIG. 12 to the left of the B axis (negative field strength or H) until the measured core magnetization meets the first threshold TH+ (YES at 208), shown as measurement M1 in FIG. 12.

In the illustrated example, once the first threshold TH+ has been met (YES at 208), the control circuitry 24 continues the processing at 210-214 by applying a continuous signal of a second (e.g., negative) polarity at 210 while measuring the core magnetization at 212 (preferably with zero primary current) and comparing the measured magnetization with a second threshold, illustrated in FIG. 12 as TH−. During the application of the second continuous signal, and before the second threshold has been met (NO at 214), the control circuitry 24 continues to apply the signal and monitor the measured magnetization based on the output of the sensor 8. Once the second threshold has been met (M2 in FIG. 12, YES at 214 in FIG. 11A), the control circuitry 24 automatically causes the coil interface circuit (e.g., circuits 26 and 28 in the system 2 of FIG. 1, or via the driver circuit 14 in the example of FIG. 10) to apply pulses to the core 6 via the compensation coil 16, and to control the polarity and energy of the individual pulses according to the sensor output signal 12a, 22a to completely or at least partially demagnetized the core 6 in a closed loop fashion at 216-226 in FIGS. 11A-11B, for example, using the techniques described above. As seen in the dashed line of FIG. 11A, moreover, the control circuitry 24 in certain embodiments may begin the application of pulses using a discreet feedback algorithm directly after the first threshold is met (YES at 208), whereas the illustrated example automatically causes the coil interface circuitry to apply the continuous signal of the second opposite polarity at 210-214 until the second threshold is met (YES at 214).

At 216 in FIG. 11A, the control circuit 24 provides the signals 24a and 24b in suitable fashion to cause the coil interface circuitry 26, 28 or 14 to apply a pulse to the compensation coil 16 of a polarity opposite to the previously applied signal, having a pulse duration set according to the satisfied threshold, again preferably with zero primary current flowing in the primary conductor 4. In the illustrated example where a positive continuous signal was applied at 204, and a subsequent negative signal was applied at 210, the pulse applied at 216 is in the positive direction, and the duration of the initial pulse at 216 is set according to the magnetization magnitude of the most recently satisfied threshold, in this case TH−. As seen in FIG. 12, moreover, application of the pulse at 216 causes the magnetization to move from M2 along the dashed line, with the control circuit 24 then grounding both ends of the compensation coil 16 at 218 in FIG. 11B, and measuring the core magnetization polarity at 220, shown as measurement M3 in FIG. 12. Thereafter at 222 in FIG. 11B, the control circuitry determines from the measurement at M3 that the core magnetization is positive, and accordingly applies a pulse at 222 in the negative direction, having a duration less than that of the initial pulse applied at 216. The control circuit 24 then determines at 224 whether a termination condition has been met, and if not (NO at 224) returns to again ground the compensation coil ends at 218 and measure the core magnetization polarity at 220. In the illustrated example of FIG. 12, this yields a negative measurement at M4, and the process 200 is continued as shown by the subsequent measurements M5 and M6 in FIG. 12 until the predefined termination condition has been satisfied (YES at 224), whereupon the process 200 is finished at 226

In another possible embodiment, a strictly continuous feedback degaussing process is implemented, with the control circuitry 24 utilizing a second threshold representing zero magnetization. In this example, the control circuitry 24 causes the coil interface circuit 26 and 28 (or 14) to apply a continuous first signal of a first polarity (e.g., positive) to the compensation coil 16 at 204 in FIG. 11A, and measures the magnetization via the sensor 8 at 206, until the first threshold is met or exceeded (YES at 208). Thereafter, the control circuit 24 causes the coil interface 26, 28, 14 to apply a continuous signal of a second opposite polarity while measuring the core magnetization at 210 and 212, and once the second threshold is met or exceeded (YES at 214), the procedure 200 is finished. In this manner, an automatic closed-loop continues demagnetization process is implemented, and thereafter the control circuitry 24 may change control mode to implement closed-loop current sensing via the system 2, with the host system in certain embodiments being able to initiate another degaussing operation via the MODE signal 24d as described above. In certain implementations, moreover, the control circuitry 24 may automatically cause the coil interface circuitry 26, 28, 14 to apply a plurality of pulses to the core 6, and to control the energy and polarity of the individual pulses at least partially according to the output signal 12a, 22a from the sensor interface circuitry 12, 22 in order to at least partially demagnetize the core 6 after the second threshold is met or exceeded as shown in FIGS. 11A-11B. In this manner, the continuous demagnetization is used as a closed-loop "coarse" demagnetization adjustment according to feedback from the sensor 8, with the optional subsequent successive approximation pulse-based demagnetization providing "fine" demagnetization adjustment in certain embodiments.

As seen in these figures, moreover, the control circuitry 24 advantageously controls the second state durations between applied pulses in the timing of the measurements to facilitate measurement of the magnetization state (polarity and/or magnitude) at a time when the ends of the compensation coil 16 have been connected to one another sufficiently long to reduce the secondary current $I_{SEC}$ to substantially zero. This facilitates precise measurement of the actual magnetization condition of the core 6, and enhances the performance of the closed-loop discrete feedback algorithm for automatic degaussing of the core 6. Moreover, this approach facilitates expeditious degaussing operation, thereby enhancing the capability of the apparatus 20 to operate within an overall system such as the closed-loop current sensing systems 2 of FIGS. 1 and 10 without lengthy intrusion into the current sensing capabilities in order to effectively degauss the core 6 with only minimal system downtime. Moreover, the illustrated example advantageously employs the pre-existing magnetic sensor 8, as well as the excitation and sensing circuitry and connections 10, 12 of the existing closed-loop current sensing system 2, and is therefore easily integrated into a single-chip solution for closed-loop current sensing driver circuits with on-board automatic degaussing.

The disclosed degaussing apparatus 20 and methods thus facilitate automatic degaussing which can be used alone or in conjunction with calibration of electrical offsets in the excitation and sensing circuitry 12. Moreover, since the apparatus 20 utilizes the feedback circuitry associated with the sensor 8 and circuitry 12, any non-calibrated offsets in such circuitry will be compensated by the automatic degaussing operation of the apparatus 20. Consequently, the demagnetizing concepts of the present disclosure can operate as a magnetizing auto zero feature, which calibrates out any electrical offsets as well, since the excitation and sensing circuitry 12 is included within the closed loop degaussing or demagnetization system 20. As a result, a separate electrical calibration is not strictly required, thereby facilitating manufacturing and operation of the apparatus 20 and the overall system 2. This advantage, moreover, is not possible with open loop systems.

In addition, the illustrated apparatus 20 advantageously provides a code 24c from which an assessment of the core magnetization can be derived, but the closed-loop degaussing approach does not require accurate calculation or estimation of the initial magnetic residue, although certain embodiments may employ this in subsequent degaussing operations to expedite the process.

Furthermore, the compensation range of the exemplary degaussing apparatus 20 is defined in the time domain, and a wide variety of magnetic bodies 6 can therefore be demagnetized using the disclosed apparatus and techniques. In this regard, as long as the settling time in the second state of each pulse cycle is sufficiently long to allow the pulse current to fall to or near zero for accurate polarity measurement, the iteration will take as long as it needs to effectively reduce the magnetization to zero or to an acceptable tolerance range around zero. Thus, the various concepts of the present disclosure can be employed in connection with any magnetic body, and any initial amount of residual magnetization can be (at least partially) degaussed. These concepts, moreover, may be implemented in connection with both external and on-chip magnetic sensors 8, and are independent of the type of magnetic sensor 8 used in the system 2.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. An automatic degaussing apparatus for degaussing a magnetic core, comprising:
    sensor interface circuitry configured to receive a signal from a sensor proximate the core and to provide an output signal indicating a magnetization polarity of the core;
    coil interface circuitry with first and second outputs coupleable with corresponding first and second ends of a compensation coil magnetically coupled with the core, the coil interface circuitry configured to selectively individually couple the first and second outputs to a pulse voltage supply node or to a common node; and
    control circuitry configured to automatically cause the coil interface circuitry to selectively apply a plurality of pulses to the core via the compensation coil, and to control a polarity and an energy of the individual pulses at least partially according to the output signal from the sensor interface circuitry to at least partially demagnetize the core in a closed-loop fashion using a discrete feedback algorithm.

2. The apparatus of claim 1, wherein the control circuitry is configured to cause the coil interface circuitry to selectively apply the plurality of pulses in a corresponding plurality of pulse cycles, the individual pulse cycles comprising:
    connection of a given one of the first and second outputs to the pulse voltage supply node and concurrent connection of the other one of the first and second outputs to the common node in a first state, and
    connection of both of the first and second outputs to the common node in a second state;

wherein the control circuitry is configured to select, for at least some of the pulse cycles, the given one of the first and second outputs for a succeeding first state according to the output signal received from the sensor interface circuitry during the immediately preceding second state to provide the next pulse to change magnetization of the core in a direction opposite to the most recently measured magnetization polarity of the core; and wherein the control circuitry is configured to control a duration of the first state in successive pulse cycles to be less than a duration of the first state in an immediately preceding pulse cycle.

3. The apparatus of claim 2, wherein the control circuitry is configured to control the duration of the first state in successive pulse cycles to be greater than half a duration of the first state in the immediately preceding pulse cycle.

4. The apparatus of claim 3, wherein the control circuitry is configured to control a duration of the second state in the individual pulse cycles to allow current flow in the compensation coil to be substantially zero before selecting the given one of the first and second outputs for the succeeding first state according to the output signal.

5. The apparatus of claim 4, wherein the control circuitry is configured to discontinue causing the coil interface circuitry to apply pulses to the core when a predetermined termination condition has been met, and to provide a Boolean code representing polarities of individual pulses applied to the core during a degaussing operation.

6. The apparatus of claim 4, wherein the control circuitry is configured to cause the control interface circuitry to connect both of the first and second outputs to the common node and to select the given one of the first and second outputs according to the output signal before causing the coil interface circuitry to apply the first of the plurality of pulses to the core.

7. The apparatus of claim 2, wherein the control circuitry is configured to select the given one of the first and second outputs independent of the output signal before causing the coil interface circuitry to apply the first of the plurality of pulses to the core.

8. The apparatus of claim 2, wherein the sensor interface circuitry is configured to provide the output signal indicating a magnetization magnitude and the magnetization polarity of the core; and wherein the control circuitry is configured, before causing the coil interface circuitry to apply the first of the plurality of pulses to the core, to cause the control interface circuitry to connect both of the first and second outputs to the common node, and to select the given one of the first and second outputs according to the magnetization polarity indicated by the output signal; and wherein the control circuitry is configured to control the duration of the first state in the first of the plurality of pulses at least partially according to the magnetization magnitude indicated by the output signal.

9. The apparatus of claim 1, wherein the control circuitry is configured to discontinue causing the coil interface circuitry to apply pulses to the core when a predetermined termination condition has been met, and to provide a Boolean code representing polarities of individual pulses applied to the core during a degaussing operation.

10. The apparatus of claim 1, wherein the sensor interface circuitry, the coil interface circuitry, the control circuitry, and the sensor are integrated in a single integrated circuit.

11. The apparatus of claim 1, wherein the control circuitry is configured to operate the sensor interface circuitry and the coil interface circuitry in a first mode to automatically degauss the magnetic core, and in a second mode to provide closed loop current sensing.

12. An automatic degaussing apparatus for degaussing a magnetic core, comprising:
a sensor interface circuit configured to receive a signal from a sensor proximate the core and to provide an output signal indicating a magnetization of the core;
a coil interface circuit with first and second outputs coupleable with corresponding first and second ends of a compensation coil magnetically coupled with the core, the coil interface circuit configured to selectively individually couple the first and second outputs to a pulse voltage supply node or to a common node; and
a control circuit configured to:
automatically cause the coil interface circuit to apply a continuous signal of a first polarity to the compensation coil until the output signal from the sensor interface circuit meets or exceeds a first threshold, and
after the output signal from the sensor interface circuit meets the first threshold, automatically cause the coil interface circuit to apply a continuous signal of a second opposite polarity to the compensation coil until the output signal from the sensor interface circuit meets or exceeds a second threshold.

13. The automatic degaussing apparatus of claim 12, wherein the control circuit is configured, after the output signal from the sensor interface circuit meets the second threshold, to:
automatically cause the coil interface circuit to apply a plurality of pulses to the core via the compensation coil, and to control a polarity and an energy of the individual pulses at least partially according to the output signal from the sensor interface circuit.

14. The apparatus of claim 13, wherein the control circuit is configured to cause the coil interface circuit to selectively apply the plurality of pulses in a corresponding plurality of pulse cycles, the individual pulse cycles comprising:
connection of a given one of the first and second outputs to the pulse voltage supply node and concurrent connection of the other one of the first and second outputs to the common node in a first state, and
connection of both of the first and second outputs to the common node in a second state;
wherein the control circuit is configured to select, for at least some of the pulse cycles, the given one of the first and second outputs for a succeeding first state according to the output signal received from the sensor interface circuit during the immediately preceding second state to provide the next pulse to change magnetization of the core in a direction opposite to the most recently measured magnetization polarity of the core; and wherein the control circuit is configured to control a duration of the first state in successive pulse cycles to be less than a duration of the first state in an immediately preceding pulse cycle.

15. The apparatus of claim 14, wherein the control circuit is configured to control the duration of the first state in successive pulse cycles to be greater than half a duration of the first state in the immediately preceding pulse cycle.

16. A closed loop method for automatically degaussing a magnetic core, the method comprising:

applying a plurality of pulses to a compensation coil magnetically coupled with the core to facilitate at least partial demagnetization of the core;

automatically controlling an energy of at least some of the pulses in a closed-loop fashion according to a discrete feedback algorithm; and automatically controlling a polarity of a given one of the individual pulses at least partially according to a magnetization polarity of the core measured while substantially no current is flowing in the compensation coil during a period of time following an immediately preceding one of the plurality of pulses.

17. The method of claim 16, wherein applying the plurality of pulses to the compensation coil comprises, in each of a plurality of pulse cycles:

connecting both ends of the compensation coil together;

measuring a magnetization polarity of the core while both ends of the compensation coil are connected together and substantially no current flows in the compensation coil;

applying a pulse to the compensation coil, the applied pulse having a polarity opposite to the measured magnetization polarity, and an energy less than that of an immediately preceding pulse.

18. The method of claim 17, comprising applying a first one of the plurality of pulses prior to measuring the magnetization polarity of the core.

19. The method of claim 16, comprising:

prior to applying the plurality of pulses, connecting both ends of the compensation coil together;

prior to applying the plurality of pulses, measuring a magnetization polarity and a magnetization magnitude of the core while both ends of the compensation coil are connected together and substantially no current flows in the compensation coil; and applying a first one of the plurality of pulses having a polarity opposite to the measured magnetization polarity, and an energy determined according to the measured magnetization magnitude of the core.

20. The method of claim 16, comprising automatically controlling the energy of individual pulses to be less than the energy of an immediately preceding pulse according to the discrete feedback algorithm.

* * * * *